United States Patent
Wang et al.

(10) Patent No.: US 12,532,646 B2
(45) Date of Patent: Jan. 20, 2026

(54) DISPLAY SUBSTRATE HAVING LIGHT PROCESSING STRUCTURE FOR REDUCING OPTICAL CROSSTALK OF ADJACENT SUB-PIXEL UNITS AND DISPLAY DEVICE

(71) Applicant: BOE Technology Group Co., Ltd., Beijing (CN)

(72) Inventors: Yingtao Wang, Beijing (CN); Qian Wu, Beijing (CN); Dacheng Zhang, Beijing (CN); Qian Jia, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/023,687

(22) PCT Filed: May 30, 2022

(86) PCT No.: PCT/CN2022/096091
§ 371 (c)(1),
(2) Date: Feb. 27, 2023

(87) PCT Pub. No.: WO2023/230799
PCT Pub. Date: Dec. 7, 2023

(65) Prior Publication Data
US 2025/0133940 A1   Apr. 24, 2025

(51) Int. Cl.
*H10K 59/80*  (2023.01)
*H10K 59/38*  (2023.01)

(52) U.S. Cl.
CPC ........... *H10K 59/879* (2023.02); *H10K 59/38* (2023.02)

(58) Field of Classification Search
CPC ...... H10K 59/879; H10K 59/38; H10K 59/00; H10K 59/8792
See application file for complete search history.

(56) References Cited

U.S. PATENT DOCUMENTS

| | | | |
|---|---|---|---|
| 2016/0254496 A1* | 9/2016 | Xu | H10K 71/00 257/40 |
| 2017/0031205 A1 | 2/2017 | Lee | |
| 2018/0156951 A1 | 6/2018 | Baek et al. | |

(Continued)

FOREIGN PATENT DOCUMENTS

| | | |
|---|---|---|
| CN | 103915482 A | 7/2014 |
| CN | 106405918 A | 2/2017 |

(Continued)

*Primary Examiner* — Tracie Y Green
(74) *Attorney, Agent, or Firm* — IPro, PLLC

(57) ABSTRACT

The display substrate includes: a substrate, a plurality of pixel units at a side of the substrate, a color filter layer at a light emergent side of the pixel units, a light processing structure, and a cover plate at a side of the color filter layer facing away from the substrate. Each of the pixel units includes a plurality of sub-pixel units. The color filter layer includes a plurality of color filter units arranged in one-to-one correspondence to the sub-pixel units. The color filter units are closely arranged. An orthographic projection of the light processing structure on the substrate covers a junction of the color filter units of different colors. The light processing structure is configured to prevent light rays emitted from the sub-pixel units and having an angle greater than a critical angle of total reflection of the cover plate from being emitted from the cover plate.

20 Claims, 8 Drawing Sheets

(56) References Cited

U.S. PATENT DOCUMENTS

| | | | |
|---|---|---|---|
| 2020/0168669 A1* | 5/2020 | Chen | ............... H10K 59/8792 |
| 2020/0287167 A1* | 9/2020 | Tian | ................... H10K 59/38 |
| 2020/0348559 A1 | 11/2020 | Zhao et al. | |
| 2022/0020965 A1 | 1/2022 | Park et al. | |
| 2023/0109619 A1* | 4/2023 | Wu | ................... H10K 59/879 |
| | | | 257/40 |

FOREIGN PATENT DOCUMENTS

| | | |
|---|---|---|
| CN | 106935724 A | 7/2017 |
| CN | 108153036 A | 6/2018 |
| CN | 108333832 A | 7/2018 |
| CN | 109324441 A | 2/2019 |
| CN | 109445164 A | 3/2019 |
| CN | 111564571 A | 8/2020 |
| CN | 114256312 A | 3/2022 |
| JP | 2016156890 A | 9/2016 |

\* cited by examiner

DISPLAY SUBSTRATE HAVING LIGHT PROCESSING STRUCTURE FOR REDUCING OPTICAL CROSSTALK OF ADJACENT SUB-PIXEL UNITS AND DISPLAY DEVICE

CROSS REFERENCE TO RELATED APPLICATIONS

This application is a national phase entry under 35 U.S.C. § 371 of International Application No. PCT/CN2022/096091, filed on May 30, 2022, the entire content of which is incorporated herein by reference.

FIELD

The present disclosure relates to the technical field of display, in particular to a display substrate and a display device.

BACKGROUND

Pixels per inch (PPI) indicate the number of pixels per inch of a display screen. The higher a PPI value is, the higher the density at which the display screen can display an image, so the pixels per inch (PPI) of the display screen keep increasing. Accordingly, the higher the display density is, the less the distance between pixels is, which causes optical crosstalk of adjacent pixels.

SUMMARY

Disclosed in the present disclosure are a display substrate and a display device, which are used for reducing optical crosstalk of adjacent sub-pixel units.

In order to achieve the above purpose, the present disclosure provides the following technical solutions.

In a first aspect, the present disclosure provides a display substrate.

The display substrate includes a substrate, a plurality of pixel units, a color filter layer, a light processing structure, and a cover plate.

The plurality of pixel units are located at a side of the substrate, and each of the plurality of pixel units includes a plurality of sub-pixel units.

The color filter layer is located at a light emergent side of the pixel units. The color filter layer includes a plurality of color filter units. The color filter units are arranged in one-to-one correspondence to the sub-pixel units, and the color filter units are closely arranged.

An orthographic projection of the light processing structure on the substrate covers a junction of the color filter units of different colors.

The cover plate is located at a side of the color filter layer facing away from the substrate.

The light processing structure is configured to prevent light rays emitted from the plurality of sub-pixel units and having an angle greater than a critical angle of total reflection of the cover plate from being emitted from the cover plate. The plurality of pixel units are located at one side of the substrate. Each of the pixel units includes a plurality of sub-pixel units for emitting light. The color filter layer is arranged at a light emergent side of the pixel units. The color filter layer includes the color filter units corresponding one to one to the sub-pixel units. The color filter units are closely arranged, so as to effectively prevent light emitted from the pixel units from leaking out from adjacent color filter units. The color filter units include at least two colors. When light emitted from the sub-pixel units passes through the color filter units, the color filter units emit at least two colors, so as to achieve a display function of the display substrate provided in the present disclosure. The cover plate for protection is arranged at the side of the color filter layer facing away from the substrate. The orthographic projection of the light processing structure on the substrate covers the junction of the color filter units of different colors. The emergent rays emitted from the sub-pixel units and having an angle greater than a critical angle of total reflection of the cover plate are prevented from being emitted from the cover plate by means of the light processing structure. That is, the light rays, having an angle greater than the critical angle of total reflection of the cover plate, in the emergent light rays of the sub-pixel units, cannot be emitted from the cover plate, such that some of the light rays at the junction of the adjacent color filter units of different colors cannot be emitted from the cover plate, so as to reduce the optical crosstalk of the adjacent sub-pixel units.

Optionally, the light processing structure includes a metasurface structure. The metasurface structure is located at a side of the color filter layer facing the substrate; and/or the metasurface structure is located at a side of the color filter layer facing away from the substrate.

Optionally, when the metasurface structure is located at the side of the color filter layer facing away from the substrate, the metasurface structure has a refractive index greater than that of the cover plate.

Optionally, when the metasurface structure is located at a side of the cover plate facing the color filter layer, the metasurface structure includes a plurality of protrusion structures. The protrusion structures protrude towards the color filter layer.

Optionally, at least one of the plurality of protrusion structures includes a plurality of discrete protrusion microstructures. A distance between the adjacent protrusion microstructures is greater than or equal to a width of the protrusion microstructure in a direction parallel to a plane where the cover plate is located.

Optionally, orthographic projections of the protrusion structure on the cover plate form an effective range. The effective range includes at least one microstructure area. The microstructure areas are distributed in an array.

Optionally, projected areas of the protrusion microstructures in the microstructure area gradually increase from an edge to a center of the microstructure area.

Optionally, a cross sectional area of the protrusion microstructures includes one of a triangle, a trapezoid, and a rectangle or a combination thereof in a direction perpendicular to the plane where the cover plate is located.

Optionally, the protrusion microstructures in the microstructure area have heights gradually increasing from the edge to the center of the microstructure area in the direction perpendicular to the plane where the cover plate is located.

Optionally, at least one of the plurality of protrusion structures includes a plurality of protrusion sub-structures, and any two adjacent protrusion sub-structures are closely arranged and make contact with each other in a direction parallel to a plane where the cover plate is located.

Optionally, surfaces of sides of the protrusion sub-structures facing away from the cover plate are smooth curved surfaces.

Optionally, the light processing structure includes a first light processing structure and a second light processing structure. The first light processing structure and the second light processing structure are both arranged on surface(s) of the cover plate. An orthographic projection of the first light processing structure on the substrate overlaps an orthographic projection of the second light processing structure on the substrate.

The first light processing structure is configured to absorb light rays having a long axis parallel to a first direction, and the second light processing structure is configured to absorb light rays having a long axis parallel to a second direction. The first direction is perpendicular to the second direction.

Optionally, the first light processing structure is located at a side of the cover plate facing the color filter layer, and the second light processing structure is located at a side of the cover plate facing away from the color filter layer.

Optionally, the first light processing structure and the second light processing structure are both located at a side of the cover plate facing the color filter layer.

Optionally, an orthographic projection of the second light processing structure on the cover plate covers an orthographic projection of the first light processing structure on the cover plate.

Optionally, the first light processing structure includes a plurality of first metal lines, each of the plurality of first metal lines extends in the first direction, and the plurality of first metal lines are arranged in the second direction.

The second light processing structure includes a plurality of second metal lines, each of the plurality of second metal lines extends in the second direction, and the plurality of second metal lines are arranged in the first direction.

The first metal lines and the second metal lines are orthogonal.

In a second aspect, the present disclosure provides a display device. The display device includes the display substrate according to any one of items in the first aspect.

Figure 1:
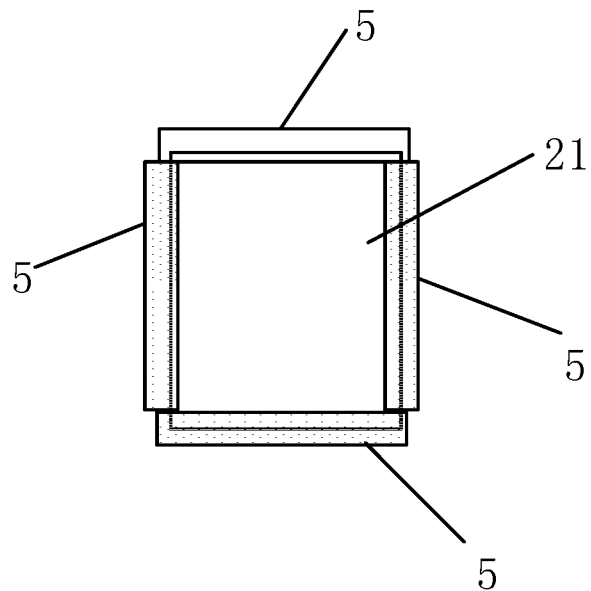
FIG. 1 is a schematic diagram of a first position relation between a light processing structure and a sub-pixel unit in a display substrate according to an embodiment of the present disclosure.

In the figures: 1—substrate; 21—sub-pixel unit; 3—color filter layer; 31—color filter unit; 4—cover plate; 5—light processing structure; 51—metasurface structure; 511—protrusion structure; 511a—protrusion microstructure; 511b—protrusion sub-structure; 52—first light processing structure; 53—second light processing structure; 6—first electrode; 7—electroluminescent layer; 8—film encapsulation layer; 9—planarization layer; and 10—second electrode.

DETAILED DESCRIPTION OF THE EMBODIMENTS

The technical solutions of embodiments of the present disclosure will be described below clearly and comprehensively in conjunction with accompanying drawings of the embodiments of the present disclosure. Apparently, the embodiments described are merely some embodiments rather than all embodiments of the present disclosure. Based on the embodiments of the present disclosure, all other embodiments acquired by those of ordinary skill in the art without making creative efforts fall within the scope of protection of the present disclosure.

The scales of the accompanying drawings in the present disclosure may be used as a reference in an actual process, but are not limited thereto. For example, the thickness and distances of film layers may be adjusted according to actual demands. The number of pixels in the display device and the number of sub-pixels in each pixel are not limited to the number shown in the drawings. The accompanying drawings described in the present disclosure are merely schematic structural diagrams, and a mode of the present disclosure is not limited to shapes or values shown in the accompanying drawings, etc.

The use of "first", "second", and other ordinal numerals in the specification is intended to avoid mixing of elements and is not intended to be limiting in term of quantity.

Figure 2:
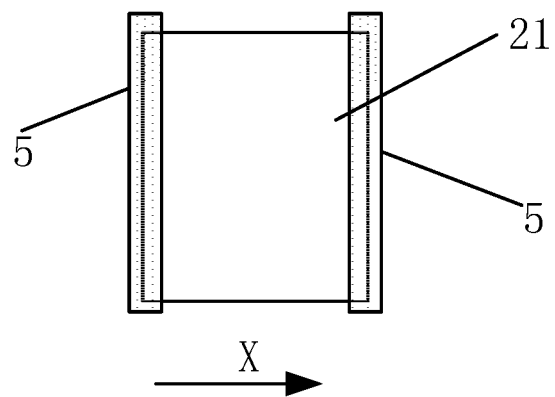
FIG. 2 is a schematic diagram of a second position relation between a light processing structure and a sub-pixel unit in a display substrate according to an embodiment of the present disclosure.
Figure 3:
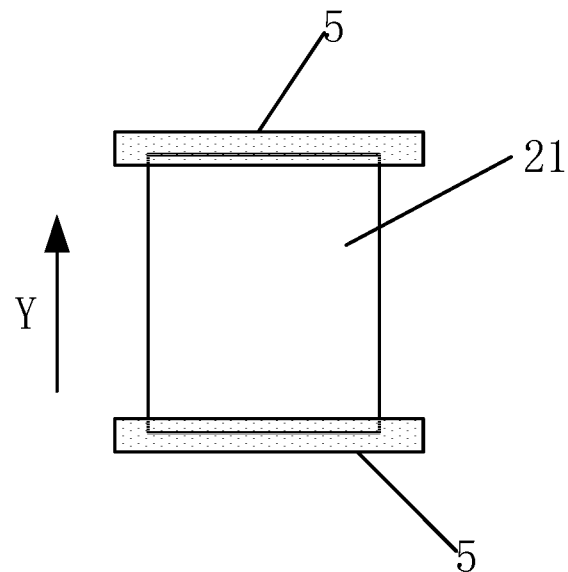
FIG. 3 is a schematic diagram of a third position relation between a light processing structure and a sub-pixel unit in a display substrate according to an embodiment of the present disclosure.
Figure 4:
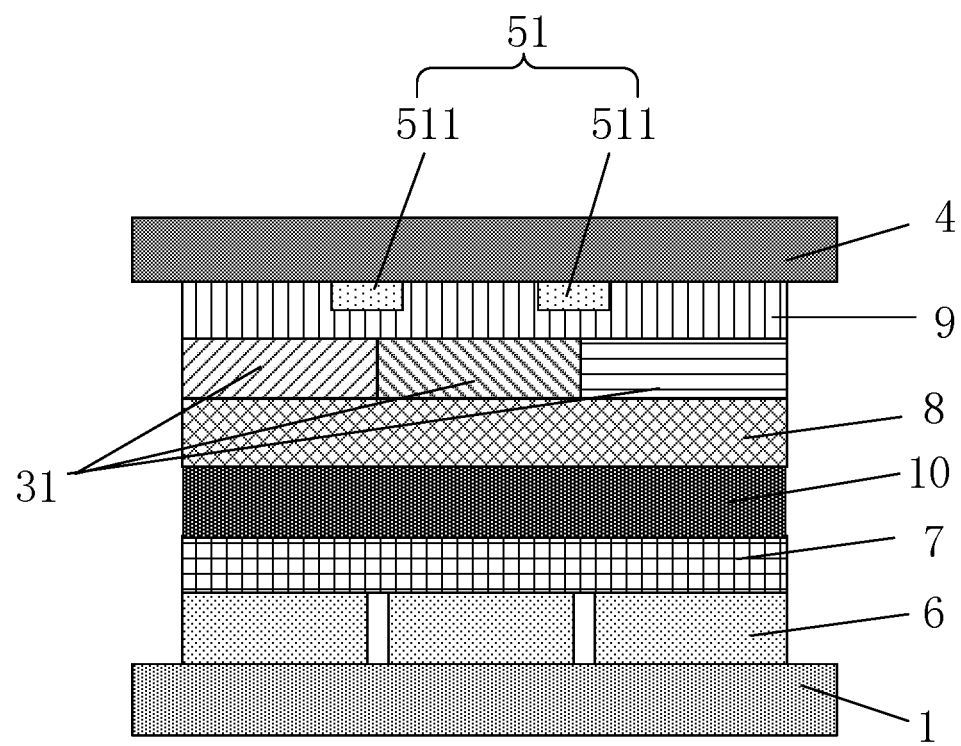
FIG. 4 is a schematic diagram of a display substrate in which a metasurface structure with a first structure is used according to an embodiment of the present disclosure.

As shown in FIGS. 1-3, embodiments of the present disclosure provide a display substrate, including a substrate 1 and a pixel unit arranged on the substrate 1. The pixel unit includes a plurality of sub-pixel units 21. With the development in the display field, pixels per inch (PPI) of the display substrate is increasingly high, resulting in that a distance between the sub-pixel units 21 is smaller and smaller. However, the small distance between the sub-pixel units 21 causes optical crosstalk of adjacent sub-pixel units 21. That is to say, the adjacent sub-pixel units 21 are prone to color mixing. In order to reduce the optical crosstalk of the sub-pixel units 21, light processing structures 5 are arranged around the sub-pixel units 21 for preventing light rays at an angle greater than a preset angle emitted from the plurality of sub-pixel units 21 from being emitted from the cover plate 4. For example, as shown in FIG. 2, the light processing structures 5 are arranged in an X direction of the sub-pixel unit 21 according to actual needs. For example, as shown in FIG. 3, the light processing structures 5 are arranged in a Y direction of the sub-pixel unit 21 according to actual needs.

As for the display substrate provided in the present disclosure, in some embodiments, the display substrate is a liquid crystal display (LCD) substrate; and in some other embodiments, the display substrate is an organic light-emitting display (OLED) substrate.

A structure of the OLED substrate having a light processing structure 5 is described in detail below.

As shown in FIGS. 4, 10, 12 and 13, and with reference to FIGS. 1-3, embodiments of the present disclosure provide a display substrate.

The display substrate includes a substrate 1, a plurality of pixel units, a color filter layer 3, a light processing structure 5, and a cover plate.

Figure 10:
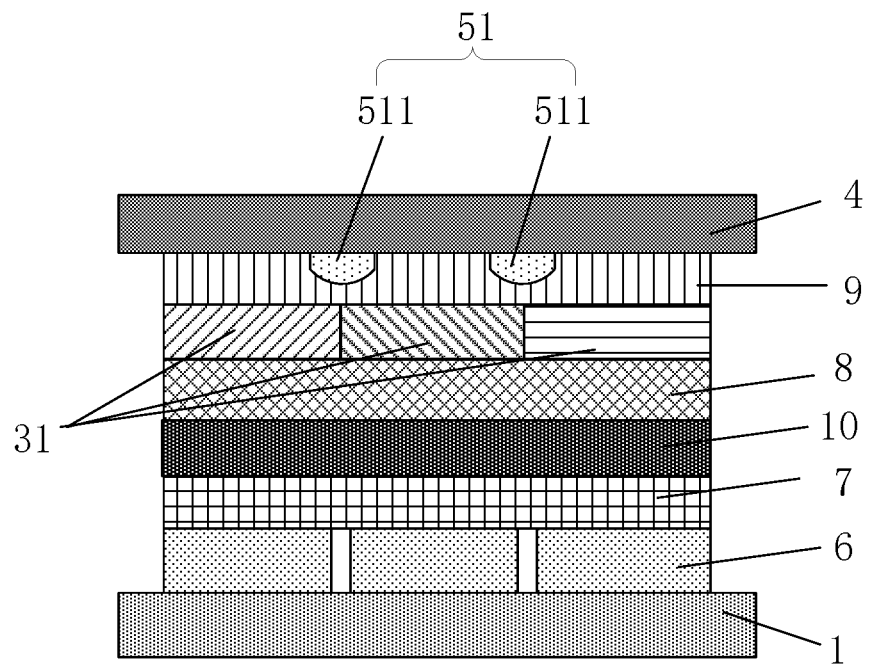
FIG. 10 is a schematic diagram of a display substrate in which a metasurface structure with a second structure is used according to an embodiment of the present disclosure.
Figure 12:
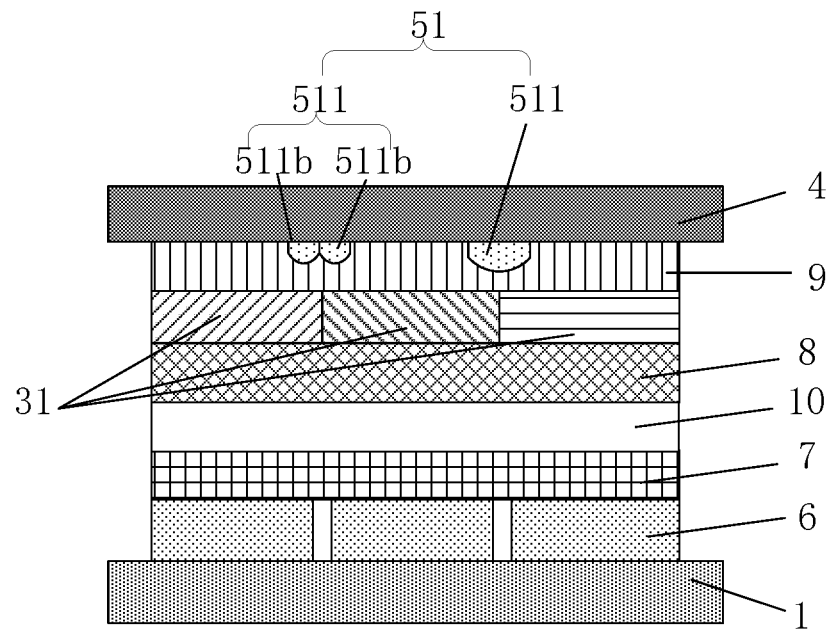
FIG. 12 is a schematic diagram of a display substrate in which a metasurface structure with a third structure is used according to an embodiment of the present disclosure.
Figure 13:
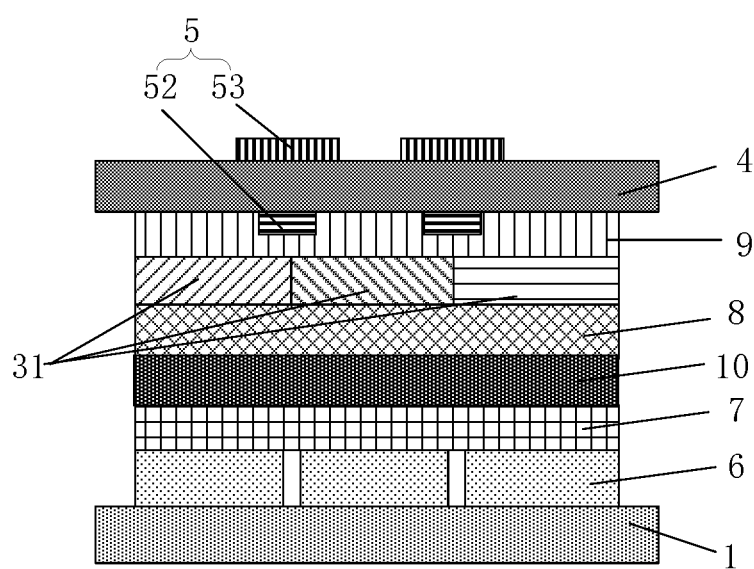
FIG. 13 is a schematic structural diagram of a display substrate in which a first light processing structure and a second light processing structure are used according to an embodiment of the present disclosure.

The plurality of pixel units are located at one side of the substrate 1. Each of the plurality of pixel units includes a plurality of sub-pixel units 21. The color filter layer 3 is located at a light emergent side of the pixel units. The color filter layer 3 includes a plurality of color filter units 31. The color filter units 31 are arranged in one-to-one correspondence to the sub-pixel units 21. The color filter units 31 are closely arranged. An orthographic projection of the light processing structure 5 on the substrate 1 covers a junction of color filter units 31 of different colors. For example, in FIG. 4, the light processing structure 5 may be a metasurface structure 51 formed by a plurality of protrusion structures 511 in one type. In FIG. 10, the light processing structure 5 may be a metasurface structure 51 formed by a plurality of protrusion structures 511 in another structure. In FIG. 12, the light processing structure 5 may be a metasurface structure formed by protrusion structures, and at least some of the protrusion structures are formed by protrusion sub-structures. In FIG. 13, the light processing structure 5 may be a first light processing structure and a second light processing structure. The cover plate is located at a side of the color filter layer facing away from the substrate. The light processing structure 5 is configured to prevent emergent rays emitted from the plurality of sub-pixel units 21 and having an angle greater than a critical angle of total reflection of the cover plate 4 from being emitted from the cover plate 4.

It is to be noted that the plurality of pixel units are located at one side of the substrate 1. Each of the pixel units includes a plurality of sub-pixel units 21 for emitting light. The color filter layer 3 is arranged at a light emergent side of the pixel units. The color filter layer 3 includes the color filter units 31 corresponding one to one to the sub-pixel units 21. The color filter units 31 are closely arranged, so as to effectively prevent light emitted from the pixel units from leaking out from adjacent color filter units 31. The color filter units 31 are of at least two colors. When light emitted from the sub-pixel units 21 passes through the color filter units 31, at least two colors of light is emitted, so as to achieve a display function of the display substrate provided in the present disclosure. The cover plate 4 for protection is arranged at the side of the color filter layer 3 facing away from the substrate 1. The orthographic projection of the light processing structure 5 on the substrate 1 covers the junction of the color filter units 31 of different colors. The emergent rays emitted from the sub-pixel units 21 and having an angle greater than a critical angle of total reflection of the cover plate are prevented from being emitted from the cover plate 4 by means of the light processing structure 5. That is, the light rays, having an angle greater than the critical angle of total reflection of the cover plate, in the emergent rays of the sub-pixel units 21 cannot be emitted from the cover plate 4, such that some of the light rays at the junction of the adjacent color filter units 31 of different colors cannot be emitted from the cover plate 4, so as to reduce the optical crosstalk of the adjacent sub-pixel units 21. For example, the light processing structure is configured to prevent emergent rays emitted from the plurality of sub-pixel units and having an angle greater than a critical angle of total reflection of the cover plate from being emitted from the cover plate. The critical angle of total reflection of the cover plate is related to refractive indexes of the cover plate and the light processing structure.

In some embodiments, not shown in the figures, the metasurface structure is located at a side of the color filter layer facing the substrate. Emergent rays emitted from the sub-pixel units and having an angle greater than the critical angle of total reflection of the cover plate are firstly blocked by means of the metasurface structure, so as to prevent optical crosstalk from occurring in adjacent color filter units in the color filter layer.

In some other embodiments, not shown in the figures, the metasurface structure is located at the side of the color filter layer facing the substrate, and further, the metasurface structure is also located at the side of the color filter layer facing away from the substrate.

Figure 5:
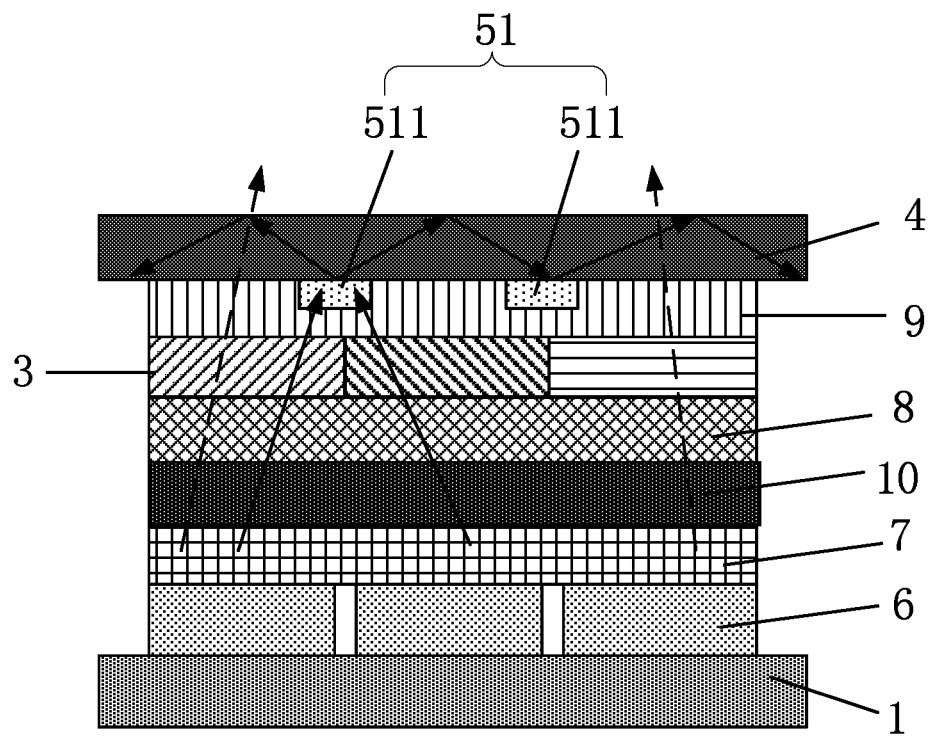
FIG. 5 is an optical path diagram of a display substrate in which a metasurface structure with a first structure is used according to an embodiment of the present disclosure.

In some other embodiments, as shown in FIGS. 5 and 10, the light processing structure 5 includes a metasurface structure 51 located on a surface of a side of the cover plate 4 facing the color filter layer 3. The metasurface structure 51 is configured to guide received light rays into the cover plate 4 for total reflection. In order to guarantee that the light rays entering the cover plate 4 from the metasurface structure 51 are totally reflected, there are two conditions, one is to guarantee that the metasurface structure 51 has a refractive index greater than that of the cover plate 4; and the other is that the light rays entering the cover plate 4 from the metasurface structure 51 have an angle greater than the critical angle. The size of the critical angle is related to the refractive indexes of the metasurface structure 51 and the cover plate 4. That is, the light rays emitted from the sub-pixel units 21 and having an angle greater than the preset angle are totally reflected in the cover plate 4 and cannot be emitted from the cover plate 4.

The metasurface structure 51 includes a plurality of protrusion structures 511. The protrusion structures 511 are protruding towards the color filter layer 3. For example, as for the metasurface structure 51, the structure of the metasurface structure 51 is manufactured by means of nano-imprinting, or semiconductor exposure. The metasurface structure 51 may be made of a transparent material with a high refractive index and a low absorption rate, such as silicon nitride (SiNx) and silicon oxide. When the refractive index of the metasurface structure 51 becomes higher, a difference will be larger compared with the refractive index of the cover plate 4, such that an effect of total reflection in the cover plate 4 is better. A small absorption rate effectively prevents the light rays emitted from the sub-pixel units 21 from being absorbed, so as not to influence display brightness of the display substrate.

As for the protrusion structures 511, there are various structures as follows.

Figure 7:
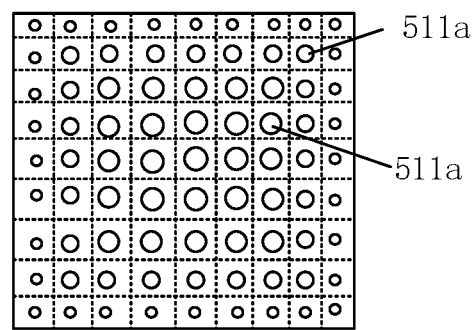
FIG. 7 is a schematic plane view of a structure of the metasurface structure in FIG. 4.
Figure 8:
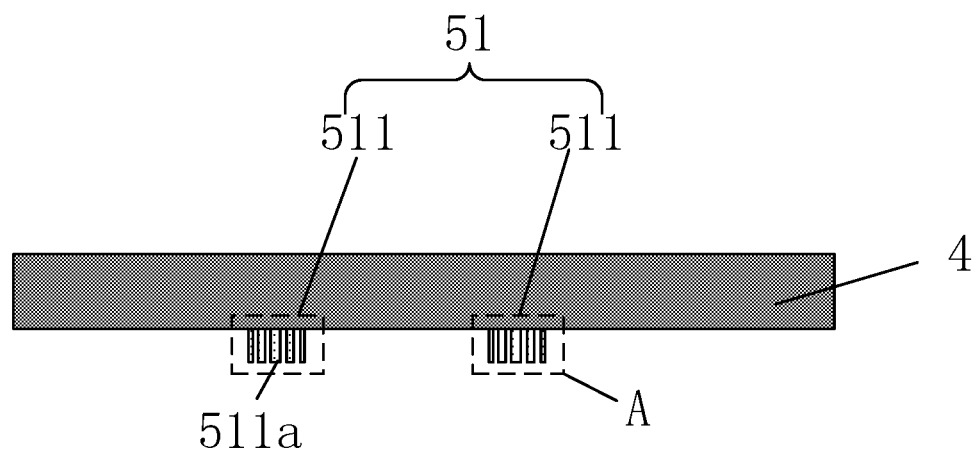
FIG. 8 is a side view of a structure of the metasurface structure in FIG. 4.
Figure 9:
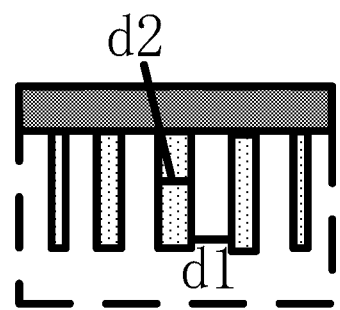
FIG. 9 is an enlarged schematic diagram of the effective range A in FIG. 8.

Structure 1, as shown in FIGS. 6-9, at least one protrusion structure 511 of the plurality of protrusion structures 511 includes a plurality of discrete protrusion microstructures 511a. As shown in FIG. 9, a distance d1 between the adjacent protrusion microstructures 511a is greater than or equal to a width d2 of the protrusion microstructure 511a in a direction parallel to a plane where the cover plate 4 is located. For example, the distance between the adjacent protrusion microstructures 511a may be designed according to practical requirements. Generally, the distance between adjacent protrusion microstructures 511a falls within 200 nm-400 nm, the width of the protrusion microstructure 511a generally falls with 50 nm-200 nm, the height of the protrusion microstructures 511a is also different according to different designs, and is generally controlled within 500 nm-1000 nm. In order to increase a total reflection effect of the protrusion structures 511 formed by the protrusion microstructures 511a, the heights of the protrusion microstructures 511a in one protrusion structure 511 are different. For example, the heights of the protrusion microstructures 511a in a center area are relatively high, and the heights of the protrusion microstructures 511a in an edge area located around the center area are relatively low.

Figure 6:
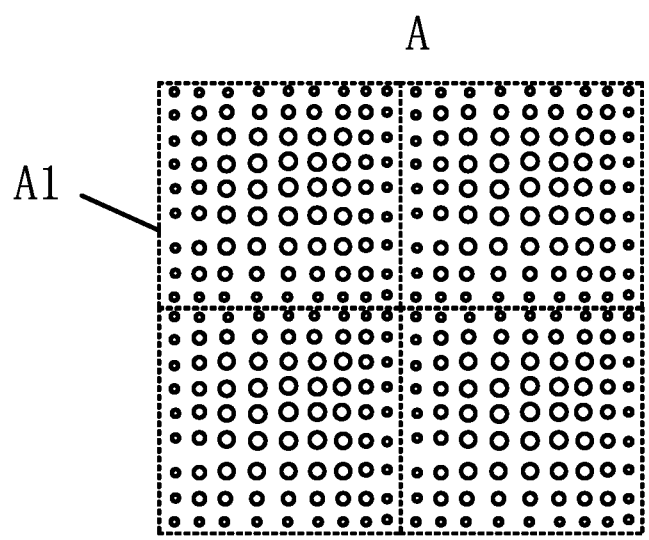
FIG. 6 is a schematic structural diagram of an effective range according to an embodiment of the present disclosure.

As shown in FIG. 6, an orthographic projection of the protrusion structure 511 on the cover plate 4 forms an effective range A. The effective range includes at least one microstructure area A1. The microstructure areas A1 are distributed in an array. An area enclosed by a dashed line in FIG. 6 is the microstructure area A1.

With continuous reference to FIG. 7, projected areas of the protrusion microstructures 511a in the microstructure area Al gradually increase from an edge to a center of the effective range. That is to say, the area separated by the dashed line in FIG. 6 is a unit area, and an area occupied by the protrusion microstructures 511a in each unit area is a duty ratio. Since the formation of adjacent protrusion microstructures 511a makes air or a planarization layer 9 fill therebetween (because the protrusion microstructures 511a are formed in a nano-imprinting manner or a semiconductor exposure manner), whether the air or the planarization layer 9 is located between the adjacent protrusion microstructures 511a, a relative refractive index of the protrusion microstructures 511a is determined. Since the refractive index of air and the refractive index of the planarization layer 9 are both less than the refractive index of the protrusion microstructures 511a, and the size of the protrusion microstructures 511a in the center area is greater than the size of the protrusion microstructures 511a in the edge area, the relative refractive index of the protrusion microstructures 511a in the center area is greater than the relative refractive index of the protrusion microstructures 511a in the edge area. Since the center area of the protrusion structure 511 is located at the junction of the adjacent color filter units 31 of different colors, light rays at the junction of the adjacent color filter units 31 of different colors are totally reflected as much as possible.

With continuous reference to FIG. 8, a cross sectional area of the protrusion microstructure 511a includes one of a triangle, a trapezoid, and a rectangle or a combination thereof in a direction perpendicular to the plane where the cover plate 4 is located. For example, in FIG. 8, the protrusion microstructure 511a has a rectangular structure. Under the condition that the protrusion microstructure 511a is of a triangular or trapezoidal shape, inclined surfaces exist. When light rays emitted from the sub-pixel units 21 perpendicularly enter the inclined surfaces of the protrusion microstructures 511a, they are reflected back, so as to reduce the light rays entering the protrusion microstructures 511a and effectively reduce an optical crosstalk phenomenon of the adjacent sub-pixel units 21.

Figure 11:
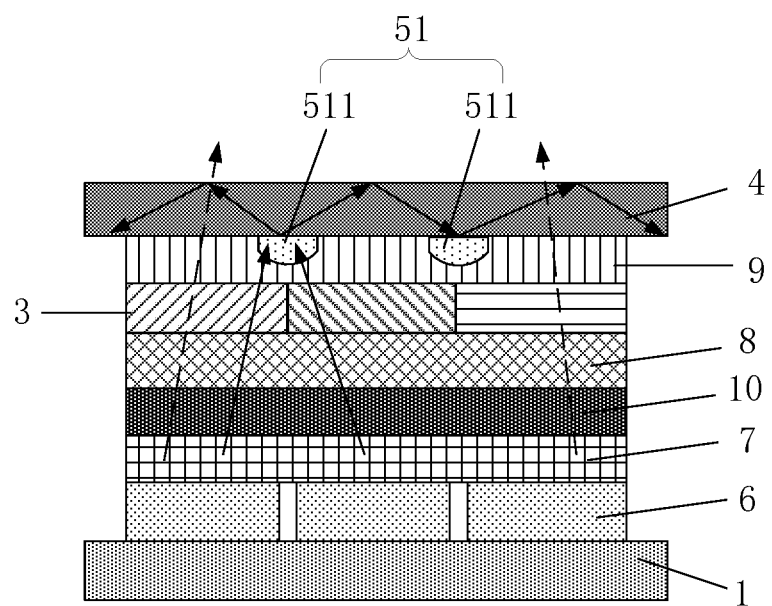
FIG. 11 is an optical path diagram of a display substrate in which a metasurface structure with a second structure is used according to an embodiment of the present disclosure.

Structure 2, the cross sectional area of at least one protrusion structure 511 of the plurality of protrusion structures 511 in a direction perpendicular to the plane where the cover plate 4 is located includes a partial circle. For example, as shown in FIGS. 10 and 11, the partial circle may be a semi-circular shape. Since the protrusion structure 511 has a curved surface, a surface area of the protrusion structure 511 making contact with light rays is increased, such that when light rays emitted from the sub-pixel units 21 perpendicularly enter the curved surface of the protrusion structure 511, they are reflected back, so as to reduce the light rays entering the protrusion structure 511, and effectively reduce an optical crosstalk phenomenon of the adjacent sub-pixel units 21.

Structure 3, at least one protrusion structure 511 of the plurality of protrusion structures 511 includes a plurality of protrusion sub-structures 511b. Any two adjacent protrusion sub-structures 511b are closely arranged and make contact with each other in a direction parallel to a plane where the cover plate 4 is located. As shown in FIG. 12, surfaces of sides of the protrusion sub-structures 511b facing away from the cover plate are smooth curved surfaces. For example, a cross sectional area of the protrusion sub-structure 511b includes a partial circle in the direction perpendicular to the plane where the cover plate 4 is located. The partial circle may be a semi-circle. Since the protrusion sub-structure 511b has a curved surface, a surface area of the protrusion sub-structure 511b making contact with light rays is increased, such that when light rays emitted from the sub-pixel units 21 perpendicularly enter the curved surface of the protrusion sub-structure 511b, they are reflected back, so as to reduce the light rays entering the protrusion sub-structure 511b, and effectively reduce an optical crosstalk phenomenon of the adjacent sub-pixel units 21. For example, two protrusion structures may each include a plurality of protrusion sub-structures 511b, and three protrusion structures may each include a plurality of protrusion sub-structures 511b, without limitation. The plurality of protrusion structures 511 may be two or more protrusion structures.

As shown in FIG. 13, the light processing structure 5 includes a first light processing structure 52 and a second light processing structure 53. The first light processing structure 52 and the second light processing structure 53 are both arranged on surface(s) of the cover plate 4. An orthographic projection of the first light processing structure 52 on the substrate 1 overlaps an orthographic projection of the second light processing structure 53 on the substrate 1. The first light processing structure 52 is configured to absorb light rays having a long axis parallel to a first direction, and the second light processing structure 53 is configured to absorb light rays having a long axis parallel to a second direction. The first direction is perpendicular to the second direction. For example, a first absorbing layer and a second absorbing layer may both be located on the same side of the cover plate 4, i.e., the first light processing structure 52 and the second light processing structure 53 are both located on a side of the cover plate 4 facing the color filter layer 3. When the first light processing structure 52 and the second light processing structure 53 are both located on the side of the cover plate 4 facing the color filter layer 3, a dielectric layer is located between the first light processing structure and the second light processing structure.

For example, the first light processing structure 52 and the second light processing structure 53 may be arranged on two separate sides.

As shown in FIG. 13, the first light processing structure 52 is located at a side of the cover plate 4 facing the color filter layer 3, and the second light processing structure 53 is located at a side of the cover plate 4 facing away from the color filter layer 3.

For example, to guarantee the absorbing effect of the light absorbing layers absorbing light rays, the orthographic projection of the second light processing structure 53 on the cover plate 4 completely covers the orthographic projection of the first light processing structure 52 on the cover plate 4.

Figure 14A:
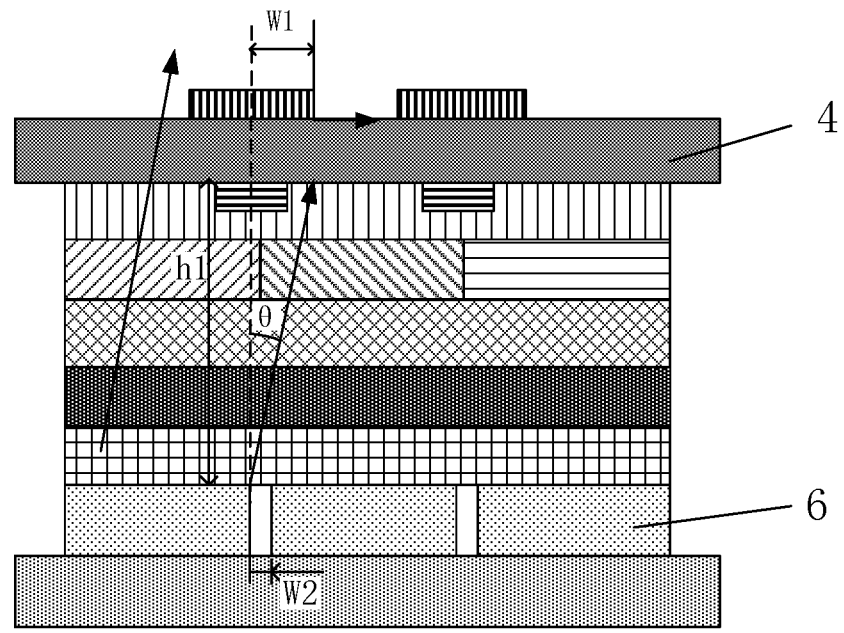
FIGS. 14A-14D are schematic diagrams showing a dimensional relation and an optical path diagram of a display substrate in which a first light processing structure and a second light processing structure are respectively on two sides of a cover plate according to an embodiment of the present disclosure.
Figure 14B:
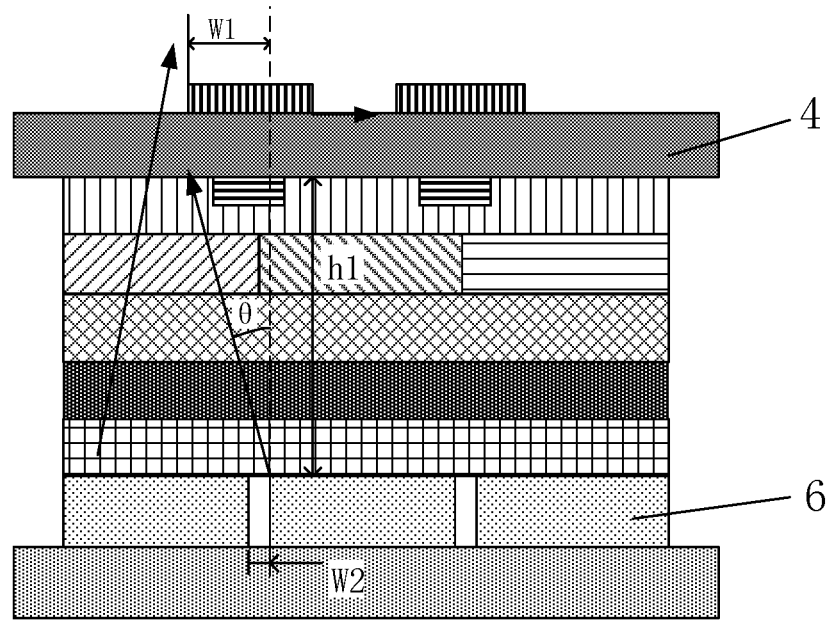
Figure 14C:
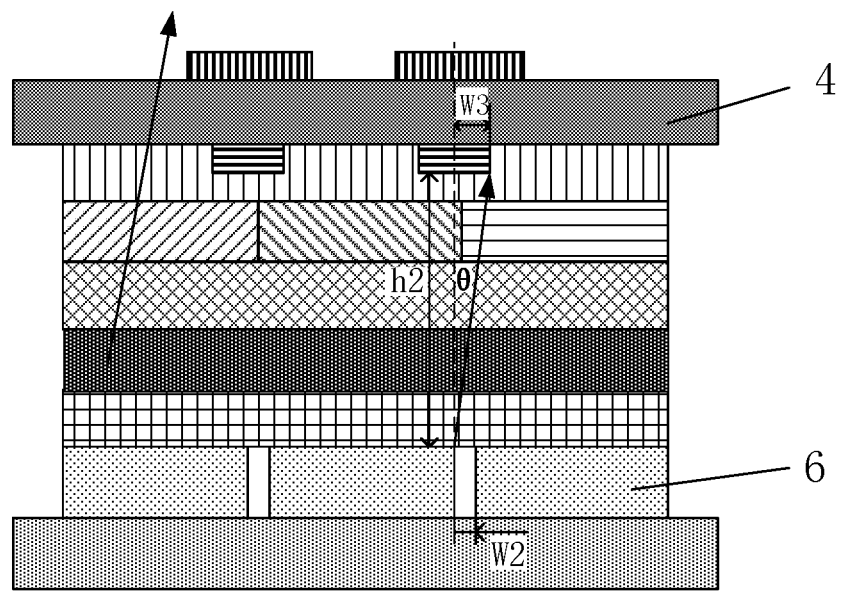
Figure 14D:
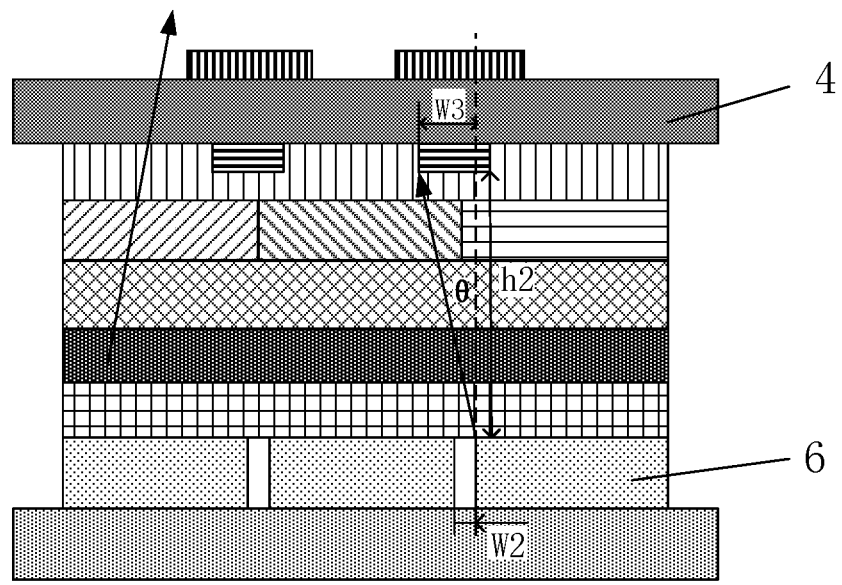

In the following, as an example, the first light processing structure and the second light processing structure are located on two sides of the cover plate respectively. As shown in FIGS. 14A and 14B, it is assumed that a perpendicular distance between an edge of a first electrode and the cover plate is h1. For example, a ratio of a sine value of an incident angle to a sine value of a refractive angle is equal to a ratio of refractive indexes of two media, i.e., a formula of: $n1/n2=\sin\theta1/\sin\theta2$. A refractive index of the cover plate is $n1=1.5$, and a refractive index of air is $n2=1$. With continuous reference to FIGS. 14A and 14B, the angle $\theta$ in the figures is an incident angle, and since a function of the first light processing structure and the second light processing structure is to absorb light rays, an emergent angle is 90°, that is, $\sin 90°=1$. According to the above formula, $\theta=\arcsin(1/1.5)$, and $w1=h1*\tan(\theta)$. With reference to FIG. 14B, a derivation process is the same, which is not repeated herein. Assuming that a distance between two adjacent first electrodes is w2, a width of the first light processing structure is $2w1-w2$. Similarly, with reference to FIGS. 14C and 14D, assuming that a perpendicular height between the edge of the first electrode to the first light processing structure of the cover plate is h2, $w3=h2*\tan(\theta)$, and a width of the first light processing structure is $2w3-w2$. In order to improve the display effect of the display substrate provided in the present disclosure, an aperture ratio needs to be increased, and therefore the width of the first light processing structure cannot be too wide. The width $2w1-w2$ of the first light processing structure is related to h1, and the thickness of the cover plate needs to be made as thin as possible. For example, the first light processing structure 52 includes a plurality of first metal lines. Each of the plurality of first metal lines extends in a first direction. The plurality of first metal lines are arranged in a second direction. The second light processing structure 53 includes a plurality of second metal lines. Each of the plurality of second metal lines extends in the second direction. The plurality of second metal lines are arranged in the first direction. The first metal lines and the second metal lines are orthogonal. For example, since the metal has light absorption properties, the first light processing structure 52 and the second light processing structure 53 are made of metal. The materials of the first light processing structure 52 and the second light processing structure 53 may be the same or different, for example, the metal is a film layer made of aluminum, copper, silver, chromium, etc.

A display substrate provided in the present disclosure includes a substrate 1. For example, the substrate 1 is made of silicon. A first electrode 6 is arranged at a side of the substrate 1. An electroluminescent layer 7, a second electrode 10, a film encapsulation layer 8, a color filter layer 3, a planarization layer 9, a light processing structure 5 and a cover plate 4 are successively arranged in a direction from the substrate 1 to the first electrode 6. The color filter layer 3 includes color filter units 31 of at least two colors. The color filter units 31 in the figure are of three different colors, for example, red, green and blue. The number of different colors may also be selected according to needs, which will not be repeated herein. For example, the cover plate 4 may be made of glass. Since the light processing structure 5 is added in the present disclosure, in order not to make the entire thickness of the display substrate thicker, the cover plate 4 is made of polyimide (PI).

In a second aspect, the present disclosure provides a display device. The display device includes the display substrate according to any one of items in the first aspect.

Apparently, those skilled in the art can make various modifications and variations to the embodiments of the present disclosure without departing from the spirit and scope of the present disclosure. In this way, if amendments and variations to the present disclosure fall within the scope of the claims of the present disclosure and the equivalents thereof, it is intended that the present disclosure also encompasses these amendments and variations.

What is claimed is:

1. A display substrate, comprising:
   a substrate;
   a plurality of pixel units at a side of the substrate, wherein each of the plurality of pixel units comprises:
   a plurality of sub-pixel units;
   a color filter layer at a light emergent side of the plurality of pixel units, wherein the color filter layer comprises:
   a plurality of color filter units, arranged in one-to-one correspondence to the plurality of sub-pixel units, wherein the plurality of color filter units are closely arranged;
   a light processing structure comprising a metasurface structure, wherein an orthographic projection of the light processing structure on the substrate covers a junction of the color filter units of different colors, and the metasurface structure is: at a side of the color filter layer facing the substrate, and/or at a side of the color filter layer facing away from the substrate; and
   a cover plate at the side of the color filter layer facing away from the substrate;
   wherein based on that the metasurface structure is at the side of the color filter layer facing away from the substrate, a refractive index of the metasurface structure is greater than a refractive index of the cover plate;
   the light processing structure is configured to prevent light rays, emitted from the plurality of sub-pixel units and having an angle greater than a critical angle of total reflection of the cover plate, from being emitted from the cover plate.

2. The display substrate according to claim 1, wherein based on that the metasurface structure is at a side of the cover plate facing the color filter layer, the metasurface structure comprises:
   a plurality of protrusion structures protruding towards the color filter layer.

3. The display substrate according to claim 2, wherein at least one of the plurality of protrusion structures comprises:
   a plurality of discrete protrusion microstructures;
   wherein a distance between adjacent protrusion microstructures is greater than or equal to a width of the protrusion microstructure in a direction parallel to a plane where the cover plate is located.

4. The display substrate according to claim 3, wherein orthographic projections of the protrusion structures on the cover plate form an effective range, the effective range comprises:
   at least one microstructure area;
   wherein the effective range comprises a plurality of microstructure areas, the plurality of microstructure areas are distributed in an array.

5. The display substrate according to claim 4, wherein projected areas of the protrusion microstructures in the microstructure area gradually increase from an edge to a center of the microstructure area.

6. The display substrate according to claim 3, wherein cross sectional areas of the protrusion microstructures comprises one or a combination of a triangle, a trapezoid, or a rectangle in a direction perpendicular to the plane where the cover plate is located.

7. The display substrate according to claim 4, wherein heights of the protrusion microstructures in the microstructure area are gradually increasing from an edge to a center of the microstructure area in a direction perpendicular to the plane where the cover plate is located.

8. The display substrate according to claim 2, wherein at least one of the plurality of protrusion structures comprises:
   a plurality of protrusion sub-structures;
   wherein any two adjacent protrusion sub-structures are closely arranged and make contact with each other in a direction parallel to a plane where the cover plate is located.

9. The display substrate according to claim 8, wherein surfaces of sides of the protrusion sub-structures facing away from the cover plate are smooth curved surfaces.

10. The display substrate according to claim 1, wherein the light processing structure comprises:
    a first light processing structure; and
    a second light processing structure;
    wherein the first light processing structure and the second light processing structure are arranged on a surface of the cover plate respectively, and an orthographic projection of the first light processing structure on the substrate overlaps an orthographic projection of the second light processing structure on the substrate; and
    the first light processing structure is configured to absorb light rays having a long axis parallel to a first direction, and the second light processing structure is configured to absorb light rays having a long axis parallel to a second direction, wherein the first direction is perpendicular to the second direction.

11. The display substrate according to claim 10, wherein the first light processing structure is at a side of the cover plate facing the color filter layer, and the second light processing structure is at a side of the cover plate facing away from the color filter layer.

12. The display substrate according to claim 10, wherein the first light processing structure and the second light processing structure are both at a side of the cover plate facing the color filter layer.

13. The display substrate according to claim 11, wherein an orthographic projection of the second light processing structure on the cover plate covers an orthographic projection of the first light processing structure on the cover plate.

14. The display substrate according to claim 13, wherein:
    the first light processing structure comprises:
       a plurality of first metal lines;
       wherein each of the plurality of first metal lines extends in the first direction, and the plurality of first metal lines are arranged in the second direction;
    the second light processing structure comprises:
       a plurality of second metal lines;
       wherein each of the plurality of second metal lines extends in the second direction, and the plurality of second metal lines are arranged in the first direction; and
       wherein the first metal lines and the second metal lines are orthogonal.

15. A display device, comprising the display substrate claim 1.

16. The display substrate according to claim 5, wherein heights of the protrusion microstructures in the microstructure area are gradually increasing from an edge to a center of the microstructure area in a direction perpendicular to the plane where the cover plate is located.

17. The display substrate according to claim 12, wherein an orthographic projection of the second light processing structure on the cover plate covers an orthographic projection of the first light processing structure on the cover plate.

18. The display substrate according to claim 17, wherein:
    the first light processing structure comprises:
       a plurality of first metal lines;
       wherein each of the plurality of first metal lines extends in the first direction, and the plurality of first metal lines are arranged in the second direction;
    the second light processing structure comprises:
       a plurality of second metal lines;
       wherein each of the plurality of second metal lines extends in the second direction, and the plurality of second metal lines are arranged in the first direction; and
    wherein the first metal lines and the second metal lines are orthogonal.

19. A display substrate, comprising:
    a substrate;
    a plurality of pixel units at a side of the substrate, wherein each of the plurality of pixel units comprises:
       a plurality of sub-pixel units;
    a color filter layer at a light emergent side of the plurality of pixel units, wherein the color filter layer comprises:
       a plurality of color filter units, arranged in one-to-one correspondence to the plurality of sub-pixel units, wherein the plurality of color filter units are closely arranged;
    a light processing structure comprising a first light processing structure and a second light processing structure, wherein an orthographic projection of the light processing structure on the substrate covers a junction of the color filter units of different colors; and
    a cover plate at a side of the color filter layer facing away from the substrate;
    wherein the light processing structure is configured to prevent light rays, emitted from the plurality of sub-pixel units and having an angle greater than a critical angle of total reflection of the cover plate, from being emitted from the cover plate;
    the first light processing structure and the second light processing structure are arranged on a surface of the cover plate respectively, and an orthographic projection of the first light processing structure on the substrate overlaps an orthographic projection of the second light processing structure on the substrate; and
    the first light processing structure is configured to absorb light rays having a long axis parallel to a first direction, and the second light processing structure is configured to absorb light rays having a long axis parallel to a second direction, wherein the first direction is perpendicular to the second direction.

20. The display substrate according to claim 19, wherein:
    the first light processing structure is at a side of the cover plate facing the color filter layer, and the second light processing structure is at a side of the cover plate facing away from the color filter layer; or
    the first light processing structure and the second light processing structure are both at a side of the cover plate facing the color filter layer.

* * * * *